United States Patent [19]

Kwasnick et al.

[11] Patent Number: 5,384,271
[45] Date of Patent: Jan. 24, 1995

[54] METHOD FOR REDUCTION OF OFF-CURRENT IN THIN FILM TRANSISTORS

[75] Inventors: Robert F. Kwasnick; George E. Possin, both of Schenectady, N.Y.

[73] Assignee: General Electric Company, Schenectady, N.Y.

[21] Appl. No.: 130,807

[22] Filed: Oct. 4, 1993

[51] Int. Cl.⁶ .................................................. H01L 21/24
[52] U.S. Cl. ..................................... 437/40; 437/101; 437/909; 437/228; 156/651
[58] Field of Search .................... 437/41, 101, 909, 21, 437/228, 40; 156/651

[56] References Cited

U.S. PATENT DOCUMENTS

| | | | |
|---|---|---|---|
| 4,704,783 | 11/1987 | Possin et al. | 437/40 |
| 5,130,263 | 7/1992 | Possin et al. | 437/40 |
| 5,137,841 | 8/1992 | Takeda et al. | 437/41 |
| 5,241,192 | 8/1993 | Possin et al. | 257/59 |
| 5,281,546 | 1/1994 | Possin et al. | 437/40 |

Primary Examiner—George Fourson
Assistant Examiner—Richard A. Booth
Attorney, Agent, or Firm—Donald S. Ingraham; Marvin Snyder

[57] ABSTRACT

A method of fabricating a thin film transistor having reduced off-current leakage includes the steps of forming a TFT body with a channel region disposed between a source electrode and a drain electrode and then passivating the exposed portion of the channel region. The passivation includes the steps of wet etching the exposed portions of the channel region in an hydrofluoric acid etchant for a first selected etch time; dry etching the exposed channel region in a reactive ion etching procedure for a second selected etch time; wet etching the channel region again with hydrofluoric acid for a third selected etch time; and then treating the channel region with a cleansing agent, such as photoresist stripper; and annealing the exposed portion of the channel region.

13 Claims, 2 Drawing Sheets

♦ IMAGER FABRICATED WITH "COMPLETE" PASSIVATION TREATMENT (TABLE 1)
□ IMAGER FABRICATED WITH "INITIAL" PASSIVATION TREATMENT ONLY (TABLE 2)

METHOD FOR REDUCTION OF OFF-CURRENT IN THIN FILM TRANSISTORS

BACKGROUND OF THE INVENTION

This invention relates to the manufacture of thin-film field effect transistors, and in particular to a method of treating the channel region of the transistor so as to reduce off-current leakage.

In solid state electronic devices thin film field effect transistors (TFTs) are commonly used as switches. In particular, in imaging and display devices, a TFT is commonly associated with each pixel to enable a respective electrical signal to be coupled to or from each individual pixel. One of the important performance factors of the TFT is low off-current, or leakage; low leakage is desirable so that the display or imager exhibits low noise, and so that an imager has a linear response to incident light. Off-current refers to the leakage current between the source and drain electrodes with the gate electrode voltage a few volts or more below the threshold voltage, that is the voltage at which the transistor starts to conduct significantly.

Imager and display arrays are typically fabricated on large substrates on which many components, including TFTs, address lines, and devices such as photosensors, are formed through the deposition and patterning of layers of conductive, semiconductive, and insulative materials. The TFT fabrication process involves several patterning steps to produce the desired arrangement of a channel region between a source and a drain electrode with the desired arrangement of semiconductive material disposed between the electrodes and over the gate electrode. The condition of the channel region of a TFT after this fabrication process can effect the off-current of the device. Common passivation techniques, such as the deposition of a dielectric layer over the channel region of the TFT after it has been fabricated, have not provided reproducibly low off-current leakage results. Another approach to passivation is disclosed in U.S. Pat. No. 4,704,783 of Possin et al. (Possin '783), which patent is assigned to the assignee of the present invention and incorporated herein by reference. The passivation process of Possin '783 includes removing a portion of the semiconductor material at the bottom of the channel region gap, plasma etching the region, exposing the region to monoethanolamine solution, rinsing with distilled water, and air baking prior to depositing a dielectric material passivation coating. As reported in Possin '783, this passivation method advantageously reduced off-current leakage in TFTs to a nominal value of about 1 picoampere (as compared with about 50 picoamperes in a TFT in which the passivating dielectric was deposited without the preliminary treatment).

It is thus an object of this invention to provide a TFT fabrication method for reliably passivating the channel region of a TFT to provide low off-current TFTs.

SUMMARY OF THE INVENTION

A method of fabricating a thin film transistor (TFT) having a low off-current includes the steps of forming a TFT body, forming a channel region in the TFT body, and passivating the channel region. The TFT body comprises a gate electrode, a gate dielectric layer disposed over the gate electrode, a layer of semiconductor material disposed over the gate dielectric layer, a doped semiconductor layer over the semiconductor material layer, and a source-drain metal layer over the doped semiconductor material. The channel region is defined by etching the source-drain metal layer, the underlying doped semiconductor layer, and a portion of the underlying semiconductor material to form source and drain electrodes disposed in a selected spaced relationship with the gate electrode. The step of passivating the channel region includes steps of wet etching the exposed channel region for a first selected etch time that is relatively short, dry etching the exposed channel region for a second selected etch time, again wet etching the exposed channel region for a third selected etch time, treating the exposed channel region with a selected cleansing solution, and annealing the TFT with the channel region exposed.

The etchant in the wet etching steps typically comprises hydrofluoric acid (HF) and the dry etching step typically comprises reactive ion etching the exposed channel region. The selected cleaning solution is commonly photoresist stripper, and the annealing step typically includes baking the exposed channel region at a temperature of about 250° C. for about 30 minutes.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description in conjunction with the accompanying drawings in which like characters represent like parts throughout the drawings, and in which:

DETAILED DESCRIPTION OF THE INVENTION

Figure 1:
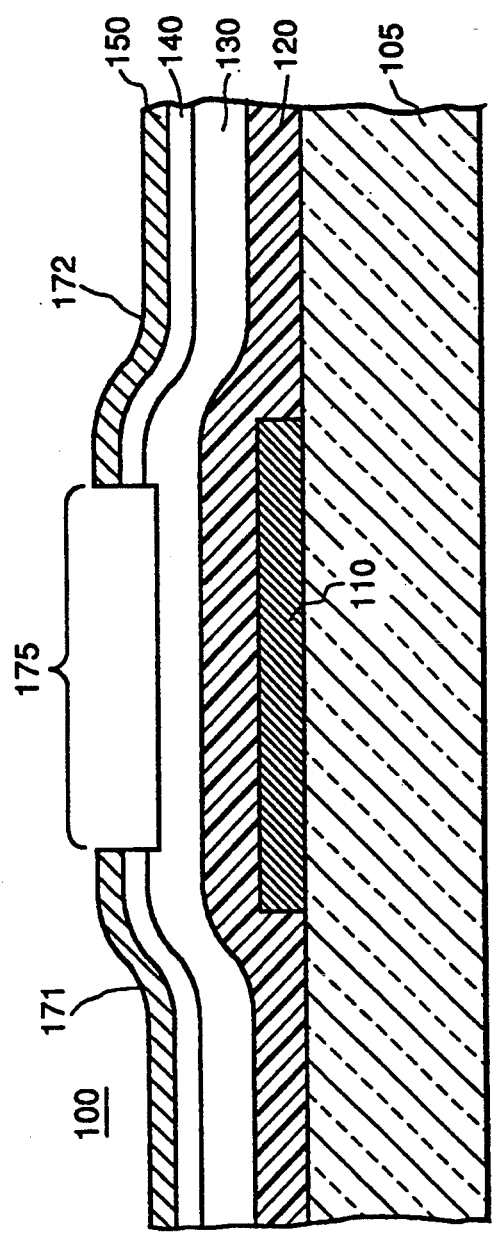
FIG. 1 is a cross sectional schematic representation a thin film transistor fabricated in accordance with this invention.

A thin film transistor (TFT) having reduced off-current leakage, as illustrated in FIG. 1, comprises a TFT body 100 formed on a substrate 105. As used herein, "TFT body" refers generally to the structure of the materials deposited and patterned to form the TFT at any point of the fabrication process; FIG. 1 illustrates a TFT at the point in the fabrication process at which the layers of various material used in the fabrication of the TFT have been patterned to provide the desired device structure.

TFT body 100 is typically formed in accordance with known patterning techniques and comprises a gate electrode 110 disposed on substrate 105; a gate dielectric layer 120 disposed over the gate electrode and portions of substrate 105; a semiconductor layer 130 disposed over gate dielectric layer 120; a doped semiconductor layer 140 disposed over semiconductor layer 130; and a source-drain metal layer 150 disposed over doped semiconductor layer 130.

Substrate 105 typically comprises glass (such as Corning 7059 glass) or the like. Gate electrode 110 typically comprises a metal such as chromium, aluminum, tungsten, or the like, and alternatively may comprise one or more layers of a conductive material. The gate electrode typically has a thickness in a range of about 0.11 μm to 0.5 μm. Gate dielectric layer 120 typically comprises silicon nitride, silicon oxide or the like, and has a thickness in the range between about 50–500 nm. Semiconductor material layer 130 typically comprises an amorphous semiconductor material such as substantially intrinsic amorphous silicon having a thickness in the range between about 50 nm to 500 nm thick. Typically, gate dielectric layer 120 and semiconductor material layer 130 are deposited by plasma enhanced chemical vapor deposition (PECVD) in a single vacuum pumpdown (other materials, such as the doped semiconductor material described below, is also advantageously deposited during the same vacuum pumpdown).

The source and drain electrodes in the TFT are formed by the deposition over TFT body 100 (comprising, at this point in the fabrication process, gate 110, gate dielectric layer 120, and semiconductor layer 130) appropriate source-drain material to form the electrodes. Typically a layer of doped semiconductive material 140, e.g., silicon doped to exhibit n+conductivity, is first deposited over TFT body 100. The doped semiconductive material comprises n+amorphous silicon (n+Si) or, alternatively, n+microcrystalline silicon. The doped semiconductive material is deposited in a PECVD process and has a thickness in the range between about 10 nm and 100 nm. The doped semiconductive material covers the exposed regions of amorphous silicon layer 130. In the typical fabrication process, a relatively thin (e.g., 10 nm–50 nm) source-drain metal layer 150 is then deposited, usually in a sputtering or evaporation process, over doped semiconductive material layer 140. These layers of source-drain material are then etched to form the field effect transistor (FET) island structure. In one embodiment, additional source-drain metal is deposited to a thickness of between about 100 nm to 1000 nm over the patterned source-drain electrodes A channel region 175 of the FET island structure is formed in TFT body 100. Channel region 175 is defined by patterning a mask (using photolithographic techniques, for example) having dimensions selected to provide the desired spatial relationship of the source and drain electrodes to the gate electrode (typically a selected overlap distance over the gate), and etching source-drain metal layer 150, the underlying doped semiconductor layer 140, and a portion of the underlying semiconductor layer 130 corresponding to the mask pattern. The overlap of the source and drain electrodes, respectively, over the gate electrode is typically selected so as to provide as low as feasible source to gate and drain to gate capacitances within the constraints of mask alignment between patterning steps. The patterned doped semiconductive material 140 and source-drain metal 150 comprise a source electrode 171 and a drain electrode 172; the identification of which portion of these patterned layers comprises the source electrode and which comprises the drain electrode is determined by the connections made to the respective electrodes and is not critical for the purposes of describing this invention. The portion of semiconductor layer 130 etched away substantially underlies the portion of the source-drain metal layer and doped semiconductor layer that is removed to form the source and the drain electrode, and a relatively thin portion (e.g., about 300Å to about 1000Å of semiconductor layer 130 is removed in channel region 175).

In accordance with this invention, after the channel region has been formed in TFT body 100, the channel region is passivated so as to reduce the off-current leakage of the TFT. The first step in the passivation procedure comprises wet etching the exposed portions of the channel region (e.g., the sidewalls of the source and drain electrodes facing channel region 175, and the interface between doped semiconductor layer 140 and semiconductor layer 130, and the exposed surface of semiconductor layer 130 in the channel region). The etchant used for the wet etch process comprises buffered hydrofluoric acid (BHF), typically diluted to 1%. This wet etch is conducted for a first selected etch time that is relatively short, e.g., about 30 seconds, although a wet etch in the range of about 20 seconds to 90 seconds will provide satisfactory results.

Following the wet etch for the first selected etch time, exposed portions of channel region 175 are dry etched in a reactive ion etching (RIE) process for a second selected etch time in the range of about 15 seconds to 60 seconds (and typically about 30 seconds). The RIE process typically comprises use of sulfur hexafluoride ($SF_6$) and hydrogen chloride (HCl) gasses in the ratio of about 20:30 (as determined by gas flow) at a power of about 0.16 W/cm$^2$ and a pressure of 100 mTorr, with a total flow of about 50 sccm.

After the dry etch for the second selected etch time, the exposed portion of channel. region 175 is again wet etched using an etchant comprising HF. This wet etch step is conducted for a third selected etch time that has a range of about 30 seconds to 90 seconds, and is typically about 60 seconds.

Next, the exposed channel region is treated with a cleansing solution; it is thought that the effect of the cleansing solution on the surface comprises removal of residue after previous etch steps and possible chemical oxidation of the exposed surface. The cleansing solution is typically photoresist stripper (such as PRS-1000 or −3000 of J.T. Baker, Inc., or alternatively R-10 from KTI, Inc.) that is applied at a temperature of about 80° C. for a period of about 5 minutes, followed by rinsing with distilled water. Alternatively, the cleansing agent comprises only distilled water.

Finally, the exposed channel region is annealed in a baking step in which the exposed channel region is heated (typically by baking the entire wafer containing TFT body 100) to a temperature of about 250° C. for a period of about 30 minutes, The annealing process typically is accomplished in an air atmosphere.

If desired, a dielectric passivation layer comprising an inorganic (e.g., silicon nitride, silicon oxide, or the like) or alternatively, an organic dielectric layer (e.g., polyimide) can be deposited over the passivated channel region (not shown in FIG. 1).

Wafers as might be used in a radiation imager (i.e., a photosensor array with associated TFTs) were fabricated in accordance with this invention. Examples of leakage data from TFTs fabricated in accordance with this invention (referred to as having the "complete passivation treatment"), both after fabrication of the TFTs and after completing the imager array fabricating steps (e.g., deposition of overlying components to form the photosensor array) are presented in Table 1. The data presented are median values of off-current leakage measured from sixteen (or more) TFTs on an imager array wafer. It is evident from the data that the complete passivation treatment of the present invention results in consistently low off-current measurements; even after formation of the assembled device (that is, with the components for a photosensor array deposited over the TFTs), the measured off-current leakage remained low, well within the range acceptable for use in an imager array. Measurements of TFT off-current were made with typical bias values of drain voltage about 10 Volts and gate voltage about −5 Volts. The channel length (the dimension of the channel between the source and drain electrodes) of the devices tested was about 3 μm, and the channel width was about 30 μm. For comparison, Table 2 presents examples of leakage data from devices fabricated with only an "initial passivation treatment", that is, devices in which the passivation treatment of the channel region was composed of the steps of the wet etch in diluted HF, exposure to the photoresist stripper, and annealing. The measurement parameters described above with respect to the data in Table 1 were similarly used to obtain the data presented in Table 2.

Data from tests of TFTs fabricated with the complete passivation treatment in accordance with this invention are as follows:

TABLE 1

Off-Current (leakage in picoamperes) for Imager Fabricated in Accordance With Invention

| TFT Sample | Initial Passivation Leakage | Post-Complete Passivation Leakage | Leakage in Assembled Device |
|---|---|---|---|
| 1 | 0.589 | 0.122 | 0.013 |
| 2 | 0.448 | 0.119 | 0.014 |
| 3 | 22.6 | 0.035 | 0.021 |
| 4 | 3.72 | 0.025 | 0.012 |
| 5 | 2.63 | 0.039 | 0.124 |
| 6 | 3.12 | 0.124 | 0.155 |
| 7 | 9.77 | 0.085 | 0.165 |
| 8 | 4.2 | 0.171 | 0.257 |
| 9 | 3.31 | 0.146 | 0.231 |

Data from tests of TFTs fabricated with only an initial passivation step as described above is as follows:

TABLE 2

Off-Current (leakage in picoamperes) for Imager Fabricated With Initial Passivation Only

| TFT Sample | Initial Passivation Leakage | Leakage in Assembled Device |
|---|---|---|
| A | 0.501 | 0.075 |
| B | 0.501 | 0.006 |
| C | 0.078 | 0.022 |
| D | 0.396 | 0.531 |
| E | 0.471 | 0.453 |
| F | 0.271 | 0.379 |
| G | 0.956 | 0.52 |
| H | 1.41 | 1.13 |
| I | 1.36 | 0.773 |
| J | 0.096 | 0.061 |
| K | 0.039 | 0.064 |
| L | 0.068 | 0.061 |
| M | 0.027 | 0.061 |
| N | 0.013 | 0.081 |
| O | 0.086 | 0.09 |
| P | 0.163 | 0.1 |
| Q | 0.157 | 0.115 |
| R | 0.121 | 0.12 |
| S | 0.133 | 0.101 |

As is apparent from the data presented in Tables 1 and 2, the passivation process of the present invention provided consistently low leakage current devices that maintained a relatively low leakage current even after completion of the imager fabrication (which involves deposition of additional materials, such as indium tin oxide, to form the photosensor array). In devices in which the leakage was high after completion of the initial passivation process, the completed device did not consistently exhibit low leakage (see, e.g., data from TFT samples "G", "H", and "I" in Table 2, samples having leakage in excess of 0.3 pA (a typically maximum acceptable value for TFT leakage after assembly).

Figure 2:
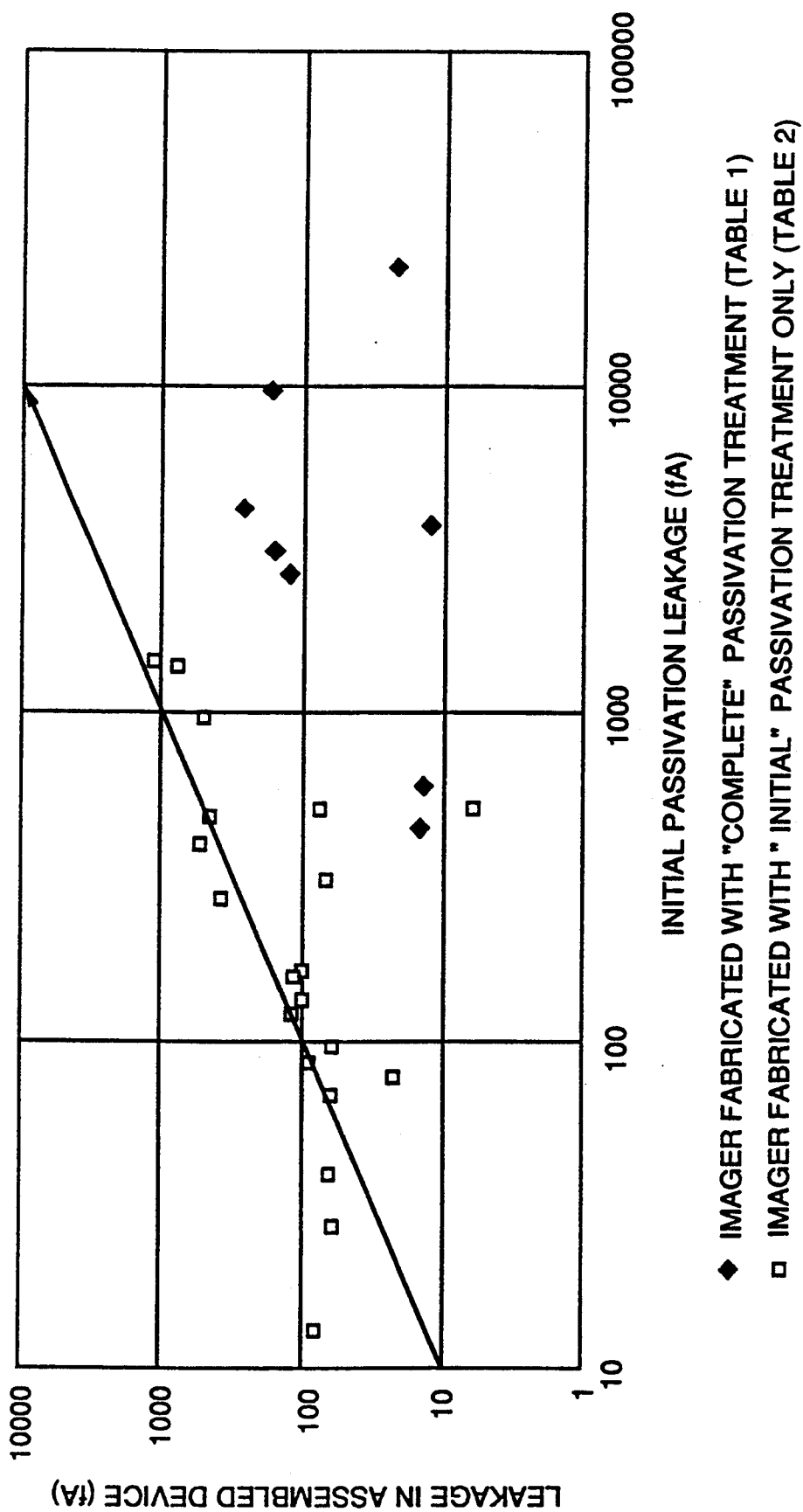
FIG. 2 is a graphic representation of off-current data of thin film transistors fabricated in accordance with the complete passivation treatment of the present invention and of thin film transistors fabricated without the complete passivation treatment of the present invention.

A graphic representation of data from Tables 1 and 2 is plotted in FIG. 2, with the initial off-current (without any passivation treatment) being plotted against the assembled device data to provide a graphic comparison showing the consistent reduced leakage obtained with the complete .passivation treatment of the present invention. In all cases, assembled imagers with TFTs having the complete passivation treatment in accordance with this invention (shown by the filled-in diamond shape symbol of the graph) evidenced an improvement (that is, a decrease in off-current) of a factor of ten over the untreated TFT. Assembled imagers having TFTs that received only the initial passivation treatment (shown by the blank-box shapes on the graph), on the other hand, did not show consistent improvement, with the leakage of some devices increasing, and with the decrease in leakage in those TFTs in which the off-current was reduced being generally less than a factor of ten.

The passivation method of the present invention thus has been shown to provide consistently low off-current leakage rates for TFTs even when such TFTs are processed on wafers with other components, such as photodiode arrays as are used in a radiation imagers.

While only certain features of the invention have been illustrated and described herein, many modifications and changes will occur to those Skilled in the art. It is, therefore, to be understood that the appended claims are intended to cover all such modifications and changes as fall within the true spirit of the invention.

What is claimed is:

1. A method of fabricating a thin film transistor (TFT) having relatively low off-current comprising the steps of:

forming a TFT body having a gate electrode, a gate dielectric layer disposed over said gate electrode, a semiconductor layer disposed over said gate dielectric layer, a doped semiconductor layer disposed over said semiconductor layer, and a source-drain metal layer disposed over said doped semiconductor layer;

forming a channel region in said TFT body, said channel region being exposed and defined by etching said source-drain metal layer, the underlying doped semiconductor layer, and a portion of the underlying semiconductor layer so as to form source and drain electrodes; and passivating the channel region, the step of passivating further comprising the steps of wet etching the exposed channel region for a first etch time, dry etching the exposed channel region for a second etch time, wet etching the exposed channel region for a third etch time, treating the exposed channel region with a cleansing solution, and annealing the exposed channel region.

2. The method of claim 1 wherein the steps of wet etching said exposed channel region for a first etch time and for a third etch time further comprises applying an etchant comprising hydrofluoric acid (HF).

3. The method of claim 2 wherein the step of dry etching said exposed channel region comprises reactive ion etching (RIE) said exposed channel region.

4. The method of claim 3 wherein said cleansing solution comprises photoresist stripper.

5. The method of claim 3 wherein said cleansing solution comprises distilled water.

6. The method of claim 3 wherein the step of annealing said exposed channel region comprises baking said TFT body at a temperature of about 250° C. for a period of about 30 minutes.

7. The method of claim 3 wherein said first etch time is in the range between about 20 seconds to 90 seconds.

8. The method of claim 3 wherein said second etch time is in the range between about 15 seconds to 60 seconds.

9. The method of claim 3 wherein said third etch time is in the range between about 30 seconds to 90 seconds.

10. The method of claim 4 wherein the step of treating the exposed channel region with photoresist stripper comprises applying said photoresist stripper to said exposed channel region for a period of about 5 minutes and a temperature of about 80° C.

11. The method of claim 1 wherein said doped semiconductor material comprises heavily doped n+silicon.

12. The method of claim 1 wherein said semiconductor material comprises amorphous silicon.

13. The method of claim 3 further comprising the step of depositing a layer of dielectric passivation material over said TFT body and said channel region.

* * * * *